United States Patent [19]

Mizumo

[11] Patent Number: 5,764,497
[45] Date of Patent: Jun. 9, 1998

[54] CIRCUIT BOARD CONNECTION METHOD AND CONNECTION STRUCTURE

[75] Inventor: Yoshiyuki Mizumo, Kaizuka, Japan

[73] Assignee: Minolta Co., Ltd., Osaka, Japan

[21] Appl. No.: 747,402

[22] Filed: Nov. 12, 1996

[30] Foreign Application Priority Data

Nov. 13, 1995 [JP] Japan ................................ 7-294441

[51] Int. Cl.[6] ................................................ H05K 1/18
[52] U.S. Cl. ........................ 361/803; 361/792; 361/751; 361/760; 361/743; 361/733; 439/65; 439/83; 439/55; 257/776; 257/779; 257/783; 257/786
[58] Field of Search ................................ 361/803, 749, 361/776, 784, 789, 790, 792, 791, 783, 751, 760, 728, 733, 736, 743, 748, 750; 439/65, 68, 70, 72, 83, 91, 76.1, 55, 67; 251/735, 736, 748, 776, 779, 782, 783, 784, 786

[56] References Cited

U.S. PATENT DOCUMENTS

| | | | |
|---|---|---|---|
| 4,999,656 | 3/1991 | Shimizu et al. | 354/195.12 |
| 5,219,292 | 6/1993 | Dickirson et al. | 439/67 |
| 5,315,484 | 5/1994 | Asano | 361/765 |
| 5,666,573 | 9/1997 | Kobayashi | 396/207 |

FOREIGN PATENT DOCUMENTS 01289189 11/1989 Japan.
03268388 11/1991 Japan.

*Primary Examiner*—Leo P. Picard
*Assistant Examiner*—David Foster
*Attorney, Agent, or Firm*—Burns, Doane, Swecker & Mathis, LLP

[57] ABSTRACT

The circuit board connecting method and a connection structure. A first flexible board is adhered to a first surface of the circuit board at a first temperature, and then a second flexible board is adhered to a second flexible board at a second temperature lower than the first temperature.

22 Claims, 3 Drawing Sheets

5,764,497

1

CIRCUIT BOARD CONNECTION METHOD AND CONNECTION STRUCTURE

BACKGROUND OF THE INVENTION

1. Field of the Invention

The present invention relates to a circuit board connection method and connection structure, and in particular, to a connection method and connection structure for connecting another board to both surfaces of a circuit board.

2. Description of the Related Art

In recent years, there has been promoted use of electronic circuits in cameras similar to many other devices, thereby allowing focal distance, exposure and so forth to be automatically adjusted. Since it is required to downsize the circuit boards constituting the electronic circuits in accordance with the downsizing of cameras, high-density mounting boards having a multi-layer structure have been used as the circuit boards.

However, high-density mounting boards having a multi-layer structure are expensive. Therefore, a circuit board is divided in specified circuit blocks, and the divided circuit boards are electrically connected with each other by means of inexpensive single-sided wiring flexible boards. With this arrangement, the amount of use of the high-density mounting boards is reduced to achieve cost reduction of the circuit boards.

Furthermore, because of a limited space in a camera, it is sometimes the case where the circuit boards are required to be divided by specified circuit blocks. Also in this case, inexpensive single-sided wiring flexible boards are used for connecting the circuit boards with each other.

For example, Japanese Laid-Open Patent Application No. Hei 1-289189 discloses reinforcement of connection of a circuit board with a flexible board by holding, by means of a retainer metal fitting, the circuit board that is connected with the flexible board by thermo-compression bonding.

However, when it is attempted to connect a flexible board to one surface of the circuit board and thereafter connect a flexible board to the other surface, a solder layer that is fixing the previously connected flexible board on the circuit board disadvantageously melts again when the flexible board to be subsequently connected is thermo-compressingly bonded to the circuit board. As a result, there occurs a problem that the contact of the previously connected flexible board with the circuit board becomes unstable.

SUMMARY OF THE INVENTION

A principal object of the present invention is to provide a connection method and connection structure for appropriately connecting another board to both surfaces of a circuit board.

Another object of the present invention is to provide a connection method and connection structure for connecting another board to both surfaces of a circuit board so that the previously connected board is not displaced or the mutual contact of boards that are connected to each other does not become unstable.

These objects of the present invention are achieved by the following connection structure.

A circuit board comprising:
  a first flexible board provided on a first surface of the circuit board;
  a second flexible board provided on a second surface of the circuit board;
  a first adhesive material which adheres the first surface of the circuit board to the first flexible board at a first temperature; and

2 a second adhesive material which adheres the second surface of the circuit board to the second flexible board at a second temperature lower than said first temperature.

These objects of the present invention are achieved also by the following connecting method.

A method for connecting a circuit board to another flexible board, said method comprising the steps:
  adhering a first surface of the circuit board to a first flexible board at a first temperature; and
  adhering a second surface of the circuit board to a second flexible board at a second temperature lower than said first temperature.

These and other objects, advantages and features of the invention will become apparent from the following description thereof taken in conjunction with the accompanying drawings which illustrate a specific embodiment of the invention.

DETAILED DESCRIPTION OF THE PREFERRED EMBODIMENTS

Figure 1:
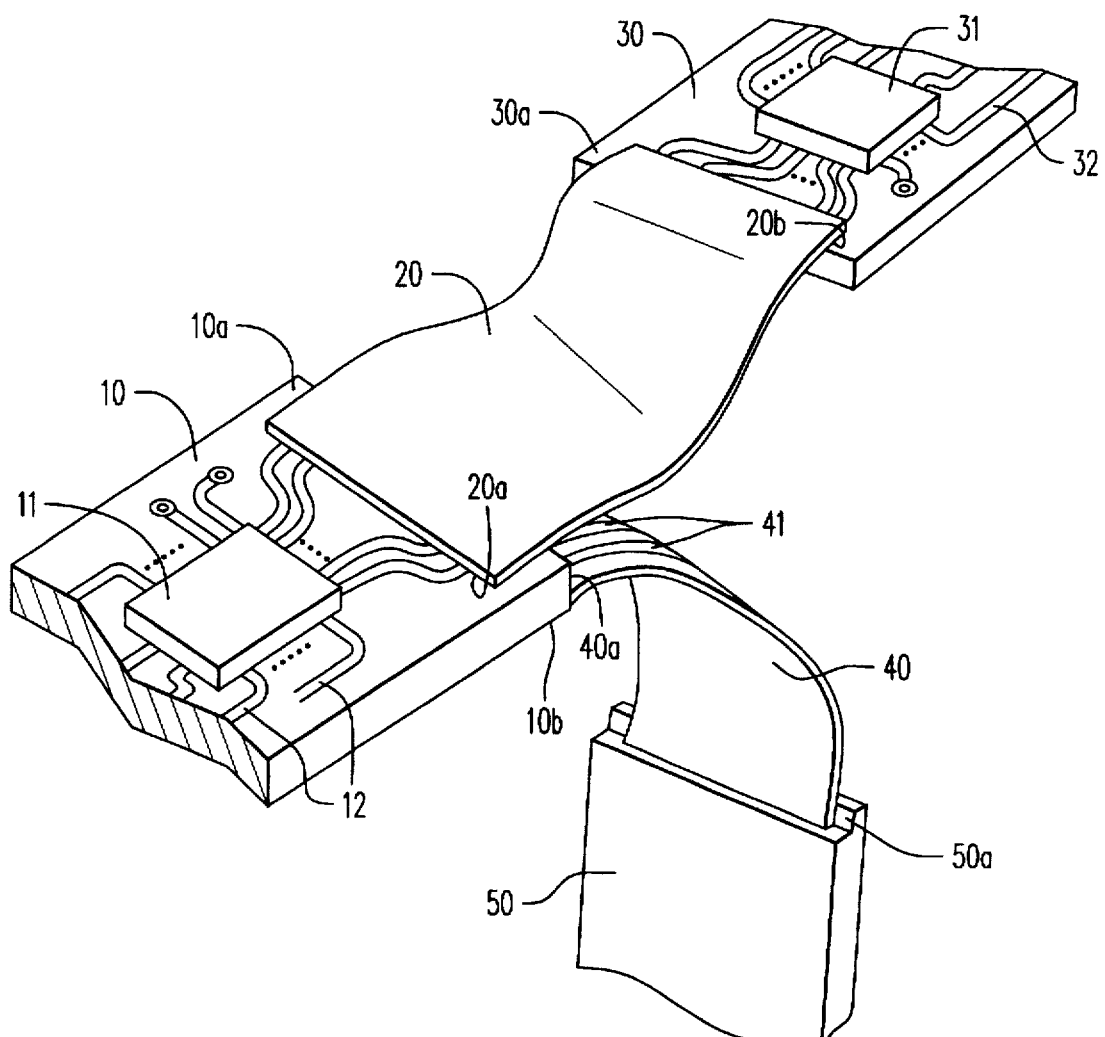
FIG. 1 is a perspective view of the connection structure of a circuit board according to an embodiment of the present invention.

FIG. 1 is a perspective view of the connection structure of a circuit board according to an embodiment of the present invention. In this figure, a circuit board 10 is connected to another circuit board 30 by way of a first flexible board 20 connected to an end 10a of its front surface, and it is connected to a liquid crystal display device 50 by way of a second flexible board 40 connected to an end 10b of its back surface.

The circuit board 10 is implemented by a high-density mounting board made of a glass fabric-based polyimide resin having a multi-layer structure or the like. On the front surface of the circuit board 10 is mounted an electronic component 11 such as an IC, and specified wiring patterns 12 are formed to constitute an electronic circuit having a specified function. The end 10a of the circuit board 10 is connected to an end 20a of the first flexible board 20 made of polyimide resin or the like. On the other hand, another end 20b of the flexible board 20 is connected to an end 30a of another circuit board 30. The circuit board 30 is implemented by a high-density mounting board made of a glass fabric-based polyimide resin having a multi-layer structure or the like similar to the circuit board 10. On the front surface of the circuit board 30 is mounted an electronic component 31 such as an IC, and specified wiring patterns 32 are formed to constitute an electronic circuit having a function different from that of the circuit board 10.

Figure 2:
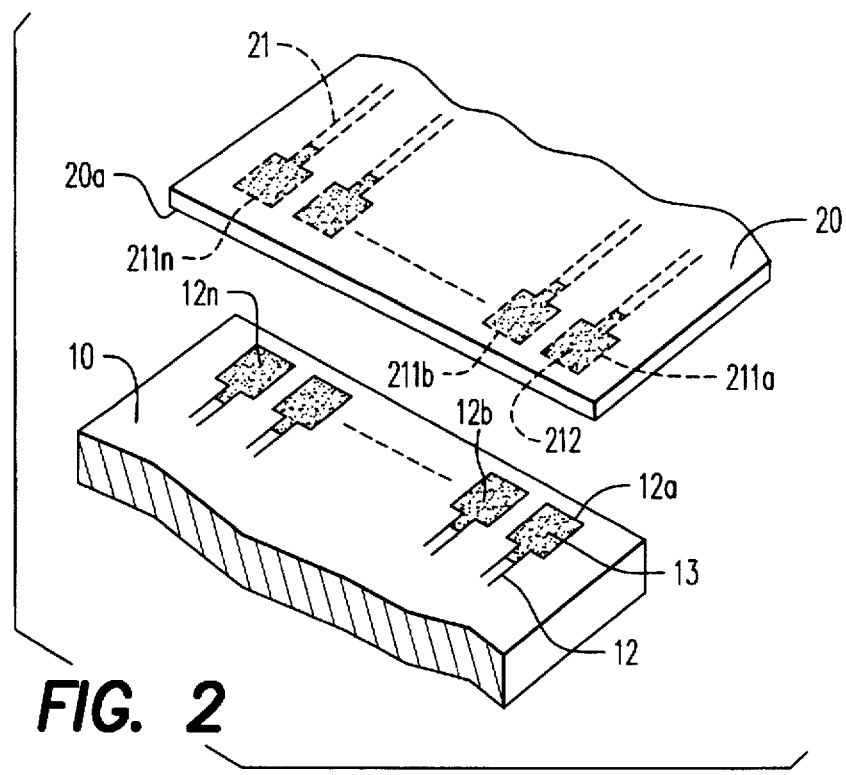
FIG. 2 is an exploded perspective view of an essential part of the connection structure of the circuit board shown in FIG. 1.

As shown in FIG. 2, at the end 10a of the front surface of the circuit board 10 is formed a plurality of connection lands 12a through 12n connected to the wiring patterns 12 as arranged in parallel with one another along the end. Further, on the back surface of the flexible board 20 are formed wiring patterns 21 corresponding in number to the connection lands 12a through 12n, and at its end 20a are formed connection lands 211a through 211n connected to the wiring patterns 21 as arranged in parallel with one another along the end. On the connection lands 12a through 12n of the circuit board 10 is provided a solder layer 13 (indicated by dots) in a solidified state, while a solder layer 212 (indicated by dots) in a similarly solidified state is provided on the connection lands 211a through 211n of the flexible board 20. It is to be noted that the wiring patterns 12, the connection lands 12a through 12n, the wiring patterns 21 and the connection lands 211a through 211n are each formed of a metal material such as Cu having a small electrical resistance. Further, the solder layer 13 and the solder layer 212 are formed of, for example, solder having a composition ratio of $Sn_{63}Pb_{36}$ and a melting point of 180° C. or higher.

Figure 3:
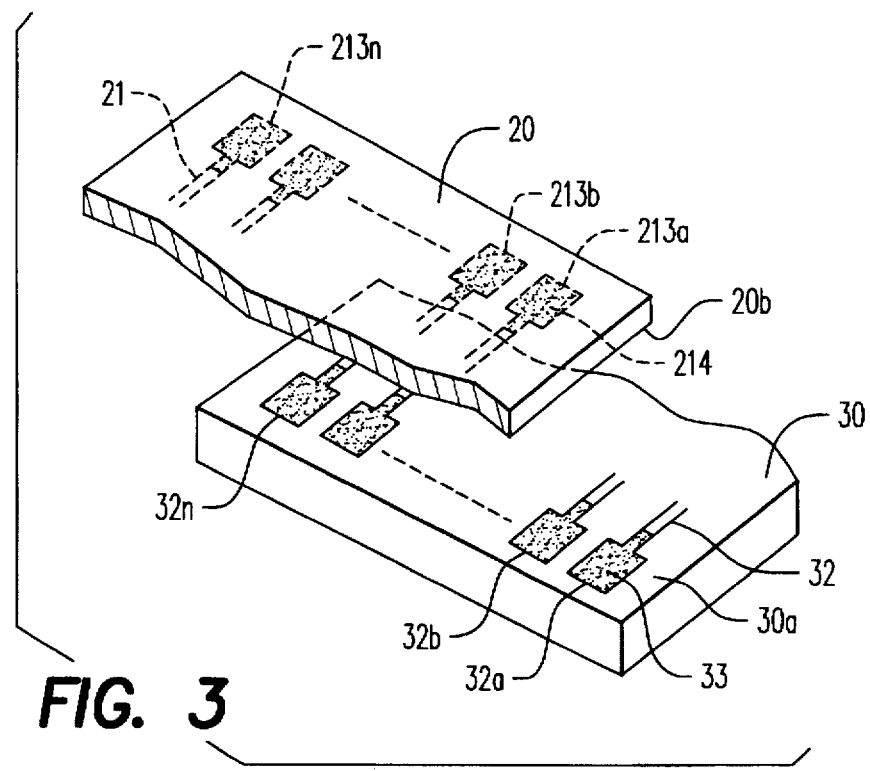
FIG. 3 is an exploded perspective view of an essential part of the connection structure of the circuit board shown in FIG. 1.

As shown in FIG. 3, at the end 30a of the front surface of the circuit board 30 is formed a plurality of connection lands 32a through 32n respectively connected to the wiring patterns 32. Further, at the end 20b of the back surface of the first flexible board 20 are formed connection lands 213a through 213n connected to the wiring patterns 21. On the connection lands 32a through 32n of the circuit board 30 is provided a solder layer 33 (indicated by dots) in a solidified state, while a solder layer 214 (indicated by dots) in a similarly solidified state is provided on the connection lands 213a through 213n of the flexible board 20. It is to be noted that the wiring patterns 32, the connection lands 32a through 32n and the connection lands 213a through 213n are each formed of a metal material such as Cu having a small electrical resistance similar to the circuit board 10. Further, the solder layer 33 and the solder layer 214 are formed of, for example, solder having a melting point of 180° C. or higher similar to the circuit board 10.

The circuit board 10 and the first flexible board 20 are connected to each other as follows. That is, the end 10a of the circuit board 10 and the end 20a of the flexible board 20 are made to abut on each other so that the connection lands 12a through 12n and the connection lands 211a through 211n are put in contact with each other. Then, a heating instrument (not shown) heated to a temperature of about 240° C. is pressed against the boards from the opposite surface of the end 20a of the flexible board 20 with a pressure applied to the boards, thereby melting the solder layers 13 and 212. Subsequently, the melted solder is cooled to be solidified, thereby completing the connection by thermo-compression bonding.

Further, the circuit board 30 and the first flexible board 20 are connected to each other similar to the case of the circuit board 10 and the first flexible board 20. That is, the end 30a of the circuit board 30 and the end 20b of the first flexible board 20 are made to abut on each other so that the connection lands 32a through 32n and the connection lands 213a through 213n are put in contact with each other. Then, a heating instrument (not shown) heated to a temperature of about 240° C. is pressed against the boards from the opposite surface of the end 20b of the flexible board 20 with a pressure applied to the boards, thereby melting the solder layers 33 and 214. Subsequently, the melted solder is cooled to be solidified, thereby completing the connection by thermo-compression bonding.

As described above, the first flexible board 20 connects the circuits of the circuit board 10 and the circuit board 30 to each other by connecting its ends 20a and 20b to the end 10a of the circuit board 10 and the end 30a of the circuit board 30.

Further, to the end 10b on the underside of the end 10a of the circuit board 10 is connected an end 40a of the front surface of the second flexible board 40 made of a heat seal material such as polyester resin, while another end 40b of the front surface of the flexible board 40 is connected to an end 50a of the liquid crystal display device 50. The liquid crystal display device 50 is to display the shooting date and so forth of the camera.

Figure 4:
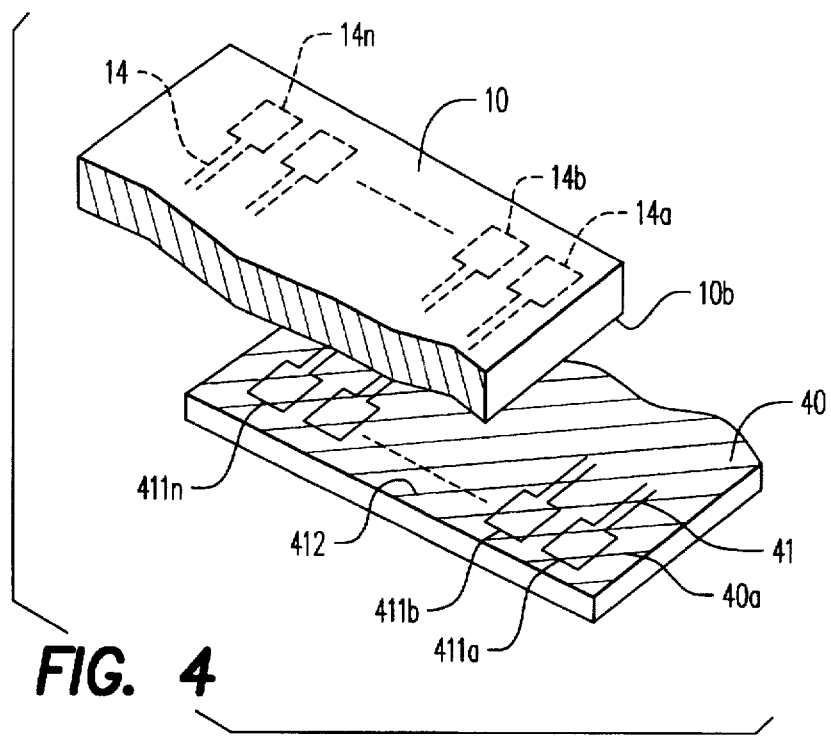
FIG. 4 is an exploded perspective view of an essential part of the connection structure of the circuit board shown in FIG. 1.

As shown in FIG. 4, on the back surface of the circuit board 10 are formed wiring patterns 14, and at its end 10b is formed a plurality of connection lands 14a through 14n connected to the wiring patterns 14 as arranged in parallel with one another along the end. Further, on the front surface of the flexible board 40 are formed wiring patterns 41 corresponding in number to the connection lands 14a through 14n, and at its end 40a are formed connection lands 411a through 411n connected to the wiring patterns 41 as arranged in parallel with one another along the end. At the end 40a of the flexible board 40 is provided a hot-melt type adhesive 412 (indicated by hatching) in a region including the connection lands 411a through 411n. It is to be noted that the wiring patterns 14 and the connection lands 14a through 14n on the back surface of the circuit board 10 are formed of a metal material such as Cu having a small electrical resistance, and the wiring patterns 41 and the connection lands 411a through 411n of the flexible board 40 are formed of a carbon based conductive material or the like. Further, the aforementioned adhesive 412 has, for example, a softening point of about 80° C.

Figure 5:
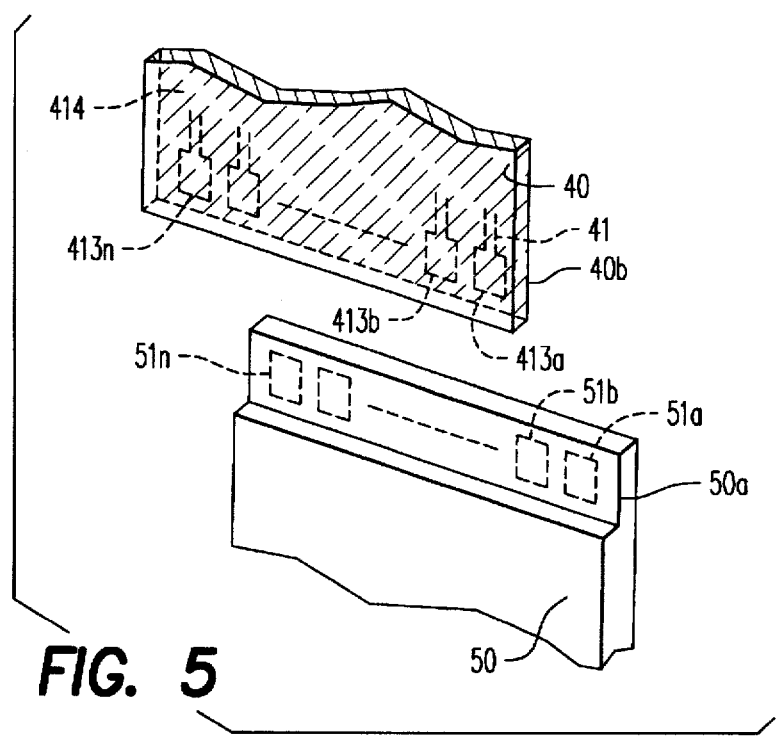
FIG. 5 is an exploded perspective view of an essential part of the connection structure of the circuit board shown in FIG. 1.

As shown in FIG. 5, at the end 50a of the liquid crystal display device 50 is formed a plurality of connection lands 51a through 51n connected to the lead sections of display elements as arranged in parallel with one another along the end. Further, at another end 40b of the front surface of the flexible board 40 are formed connection lands 413a through 413n connected to the wiring patterns 41 as arranged in parallel with one another along the end. At the end 40b of the flexible board 40 is provided a hot-melt type adhesive 414 (indicated by hatching) in a region including the connection lands 413a through 413n. It is to be noted that the connection lands 51a through 51n are formed of an Al based metal material, and the connection lands 413a through 413n are formed of a carbon based conductive material or the like. Further, the aforementioned adhesive 414 has a softening point lower than the melting point of the solder layers 13 and 212 by 30° C. or more, for example, a softening point of about 80° C.

Further, it is preferable that a heating instrument is heated to a temperature higher than the softening point of the adhesive 412 by 70° C. or more in the view of the heating efficiency. Therefore, it is desirable that the adhesive 412 has the softening point lower than the melting point of the solder layers 13 and 212 by 30° C. or more, preferably, 70° C. or more.

It is acceptable to provide the adhesive 412 on the entire surface of the flexible board 40 so as to make it function as a cover layer, and further provide, if necessary, a protection coat on the region except for the connection lands.

The above-mentioned circuit board 10 and the second flexible board 40 are connected to each other as follows. That is, the end 10b of the circuit board 10 and the end 40a of the flexible board 40 are made to abut on each other so that the connection lands 14a through 14n and the connection lands 411a through 411n are placed in positions where they face each other. Then, a heating instrument (not shown) heated to a temperature of about 150° C. is pressed against the boards from the opposite surface of the end 40a of the flexible board 40 with a pressure applied to the boards, thereby melting the adhesive 412. Part of the melted adhesive 412 that has been provided on the connection lands is forced out of the connection lands by the pressure force. Subsequently, the adhesive 412 is cooled to be hardened, thereby completing the thermo-compression bonding process. By this operation, both the ends 10b and 40a are made to adhere to each other in the region except for the surfaces of the connection lands, and the connection lands 14a through 14n and the connection lands 411a through 411n are connected with each other. It is to be noted that the connection lands 14a through 14n and the connection lands 411a through 411n are not directly bonded to each other, and therefore, a contact resistance is greater than that achieved by solder results. Although the contact resistance further increases to some extent if the adhesive is left on the connection land surfaces, since no large current flows on the liquid crystal display device 50 side, there occurs no problem due to the fact that the contact resistance is great. Furthermore, since the heating temperature is about 150° C. being lower than the aforementioned melting point of solder by 30° C. or more, this causes neither the problem that the solder connecting the circuit board 10 with the first flexible board 20 melts again to incur displacement of the first flexible board 20 nor the problem that the contact of the connection lands enters into an unstable state.

Since the end 10a of the front surface and the end 10b of the back surface of the circuit board 10 are separated apart by the circuit board 10 itself, the temperature to be actually applied to the solder further reduces, and there is no such possibility that the solder will melt again also from the above point of view.

The liquid crystal display device 50 and the second flexible board 40 are connected to each other similar to the case of the circuit board 10 and the second flexible board 40. That is, the end 50a of the liquid crystal display device 50 and the end 40b of the second flexible board 40 are made to abut on each other so that the connection lands 51a through 51n and the connection lands 413a through 413n are placed in positions where they face each other. Then, a heating instrument (not shown) heated to a temperature of about 150° C. is pressed against the boards from the opposite surface of the end 40b of the flexible board 40 with a pressure applied to the boards, thereby melting the adhesive 414. Subsequently, the adhesive 414 is cooled to be hardened, thereby completing the thermo-compression bonding process. By this operation, the adhesive 414 makes both the ends 50a and 40b adhere to each other in the region except for the surfaces of the connection lands, thereby connecting the connection lands 51a through 51n with the connection lands 413a through 413n. It is to be noted that the connection lands 51a through 51n and the connection lands 413a through 413n are not directly bonded to each other, and therefore, a contact resistance is greater than that achieved by solder results. However, since no large current flows on the liquid crystal display device 50 side, there occurs no problem due to the fact that the contact resistance is great. Furthermore, since the heat applied to the second flexible board 40 is lower than the heat applied to the first flexible board 20, a heat seal material being less expensive than the first flexible board 20 can be used, contributing to cost reduction.

As described above, the second flexible board 40 connects the circuit board 10 with the liquid crystal display device 50 by connecting its ends 40a and 40b to the end 10b of the circuit board 10 and the end 50a of the liquid crystal display device 50, respectively. With this arrangement, the liquid crystal display device 50 can be driven by an output from the circuit board 10.

In the above embodiment, the connection lands 12a through 12n on the front surface of the circuit board 10 are connected with the connection lands 211a through 211n on the back surface of the first flexible board 20 by means of solder, and the connection lands 14a through 14n on the back surface of the circuit board 10 are connected with the connection lands 411a through 411n on the front surface of the second flexible board 40 by means of the hot-melt type adhesive. However, it is acceptable to connect the connection lands 12a through 12n on the front surface of the circuit board 10 with the connection lands 211a through 211n on the back surface of the first flexible board 20 by means of solder, and connect the connection lands 14a through 14n on the back surface of the circuit board 10 with the connection lands 411a through 411n on the front surface of the second flexible board 40 by means of a conductive adhesive in which a conductive material powder such as Ag powder is mixed with a resin having a hardening temperature lower than the melting point of the aforementioned solder by 30° C. or more, preferably, 70° C. or more.

Otherwise, it is acceptable to connect the connection lands 12a through 12n on the front surface of the circuit board 10 with the connection lands 211a through 211n on the back surface of the first flexible board 20 by means of a high-temperature solder having a melting point of, for example, 320° C., and connect the connection lands 14a through 14n on the back surface of the circuit board 10 with the connection lands 411a through 411n on the front surface of the second flexible board 40 by means of a low-temperature solder having a melting point of, for example, 160° C. By thus connecting the connection lands 14a through 14n on the back surface of the circuit board 10 with the connection lands 411a through 411n on the front surface of the second flexible board 40 by means of the conductive adhesive or the low-temperature solder, the contact resistance of the connection lands is reduced, thereby allowing connection with a circuit board or the like through which a large current flows. In this case, it is proper to use the conductive adhesive or the low-temperature solder also for the connection lands 413a through 413n at the end 40b on the front surface of the second flexible board 40.

Further, it is desirable that the above low-temperature solder has the melting point lower than the melting point of the high-temperature solder by 30° C. or more, preferably, 70° C. or more.

Furthermore, in the above embodiment, the hot-melt type adhesives 412 and 414 to be used for connecting the second flexible board 40 with the circuit board 10 and the liquid crystal display device 50 are provided on the entire flexible board 40 or in the peripheral region including the connection lands 411a through 411n and 413a through 413n. However, when the adhesive is the conductive adhesive, it may be provided only on the connection lands similar to the case of solder. With this arrangement, a slightly reduced adhesive strength results; however, there occurs no practical problem unless a great tension force is applied to it.

Moreover, although the solder layer is provided on each of the front surface of the circuit board 10 and the back surface of the first flexible board 20 in the above embodiment, it may be provided on either of the front surface of circuit board 10 or the back surface of the first flexible board 20.

Although the adhesive is provided only on the front surface of the second flexible board 40 in the above embodiment, it may be provided also on the back surface of the circuit board 10, and on either of the front surface of the second flexible board 40 or the back surface of the circuit board 10.

Furthermore, a flexible board is connected to both surfaces of a hard circuit board in the above embodiment; however, arbitrary combinations of board types are tolerated. Moreover, although the above embodiment is of a circuit board for use in a camera, the present invention can be applied to the circuit boards of a variety of other devices.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A circuit board comprising:
   a first board which has a first land portion and a second land portion respectively on a first surface and a second surface thereof;
   a second board which has a third land portion opposite to said first land portion of the first board;
   a third board which has a fourth land portion opposite to said second land portion of the first board;
   a first adhesive material which adheres the first land portion to the third land portion at a first temperature; and
   a second adhesive material which adheres the second land portion to the fourth land portion at a second temperature lower than said first temperature.

2. The circuit board as claimed in claim 1 wherein said second temperature is lower than said first temperature by 30° C. or more.

3. The circuit board as claimed in claim 1 wherein the first land portion includes a plurality of lands, and the third land portion includes a plurality of lands corresponding to said plurality of lands of the first land portion.

4. The circuit board as claimed in claim 1 wherein the second land portion includes a plurality of lands, and the fourth land portion includes a plurality of lands corresponding to said plurality of lands of the second land portion.

5. The circuit board as claimed in claim 1 wherein the first adhesive material is formed of solder, and the second adhesive material is formed of hot-melt type adhesive.

6. The circuit board as claimed in claim 5 wherein the second adhesive material is formed of a resin material.

7. The circuit board as claimed in claim 5 wherein the hot-melt type adhesive has a softening point lower than a melting point of the solder by 30° C. or more.

8. The circuit board as claimed in claim 6 wherein the resin material is incorporated with a conductive material powder.

9. The circuit board as claimed in claim 6 wherein the resin material has a hardening temperature lower than a melting point of the solder by 30° C. or more.

10. The circuit board as claimed in claim 1 wherein the second adhesive material is formed of solder having a melting point lower than a melting point of the solder forming the first adhesive material by 30° C. or more.

11. The circuit board as claimed in claim 1 wherein the first board has a multi-layer structure, and the second board is a flexible board having a land portion on a single side.

12. The circuit board as claimed in claim 11 wherein the third board is a flexible board having a land portion on a single side.

13. The circuit board as claimed in claim 12 wherein the third board is connected to a first electric component, and the second board is connected to a second electric component on which a larger current flows than the current flowing on said first electric component.

14. A circuit board comprising:
   a first flexible board provided on a first surface of the circuit board;
   a second flexible board provided on a second surface of the circuit board;
   a first adhesive material which adheres the first surface of the circuit board to the first flexible board at a first temperature; and
   a second adhesive material which adheres the second surface of the circuit board to the second flexible board at a second temperature lower than said first temperature.

15. A method for connecting a first land portion and a second land portion of a first board respectively to a third land portion of a second board and a fourth land portion of a third board, said method comprising the steps:
   adhering the first land portion of the first board to the third land portion of the second board at a first temperature; and
   adhering the second land portion of the first board to the fourth land portion of the third board at a second temperature lower than said first temperature.

16. The method as claimed in claim 15 wherein the second temperature is lower than the first temperature by 30° C. or more.

17. The method as claimed in claim 16 wherein the adhering of the first land portion to the third land portion is carried out by means of a first adhesive material, and the adhering of the second land portion to the fourth land portion is carried out by means of a second adhesive material which has a melting point lower than a melting point of the first adhesive material.

18. The method as claimed in claim 16 wherein the adhering of the first land portion to the third land portion is carried out by means of a first adhesive material, and the adhering of the second land portion to the fourth land portion is carried out by means of a second adhesive material which has a hardening temperature lower than a melting point of the first adhesive material.

19. The method as claimed in claim 17 further comprising the steps:
   heating the first and the second boards from the opposite surface of the third land portion of the second board to melt the first adhesive material;
   cooling the melted first adhesive material to solidify;
   heating against the first and the third boards from the opposite surface of the fourth land portion of the third board to melt the second adhesive material without melting the first adhesive material; and
   cooling the melted second adhesive material to solidify.

20. The method as claimed in claim 17 wherein the first adhesive material is provided on at least either of the first land portion of the first board or the third land portion of the second board.

21. The method as claimed in claim 17 wherein the second adhesive material is provided on at least either of the second land portion of the first board or the fourth land portion of the second board.

22. A method for connecting a circuit board to another flexible board, said method comprising the steps:
   adhering a first surface of the circuit board to a first flexible board at a first temperature; and
   adhering a second surface of the circuit board to a second flexible board at a second temperature lower than said first temperature.

* * * * *